(12) United States Patent
Gebhardt et al.

(10) Patent No.: US 8,385,033 B2
(45) Date of Patent: Feb. 26, 2013

(54) EMERGENCY RUN-DOWN UNIT FOR SUPERCONDUCTING MAGNETS

(75) Inventors: Matthias Ludwig Gebhardt, Erlangen (DE); Robert James McGregor, Oxon (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 956 days.

(21) Appl. No.: 11/971,680

(22) Filed: Jan. 9, 2008

(65) Prior Publication Data
US 2008/0169889 A1 Jul. 17, 2008

(30) Foreign Application Priority Data
Jan. 10, 2007 (GB) .................... 0700441.9

(51) Int. Cl.
*H02H 7/00* (2006.01)
*H02H 9/00* (2006.01)
(52) U.S. Cl. ........................................ 361/19
(58) Field of Classification Search ............. 361/19
See application file for complete search history.

(56) References Cited

U.S. PATENT DOCUMENTS

| | | | | |
|---|---|---|---|---|
| 3,384,762 | A | * | 5/1968 | Mawardi ............... 327/366 |
| 4,189,693 | A | | 2/1980 | Satti |
| 4,227,092 | A | | 10/1980 | Campagnuolo et al. |
| 4,486,800 | A | | 12/1984 | Franksen |
| 4,994,935 | A | * | 2/1991 | Takechi ............... 361/141 |
| 5,683,179 | A | * | 11/1997 | Lowry ............... 374/17 |
| 6,034,492 | A | | 3/2000 | Saito et al. |
| 2007/0052304 | A1 | * | 3/2007 | Masson et al. ............ 310/52 |

FOREIGN PATENT DOCUMENTS

| | | |
|---|---|---|
| CN | 1238431 A | 12/1999 |
| CN | 2729360 Y | 9/2005 |
| GB | 2 195 053 A | 3/1988 |
| GB | 2 232 820 A | 12/1990 |
| GB | 2 295 492 A | 5/1996 |
| GB | 2 302 067 A | 1/1997 |
| GB | 2 329 958 A | 4/1999 |
| GB | 2 394 926 A | 5/2004 |
| GB | 2 414 806 A | 12/2005 |
| JP | 61-127106 A | 6/1986 |
| JP | 1-291852 A | 11/1989 |
| JP | 5-182829 A | 7/1993 |
| WO | WO 2006/046937 A1 | 5/2006 |

OTHER PUBLICATIONS

A. Ninomiya et al. "Quench of Superconducting Magnet Induced by Mechanical Disturbance Using Impact Hammer", IEEE Transactions on Magnetics, vol. 32, No. 4, Jul. 1996, pp. 3081-3084.
UK Search Report dated Oct. 3, 2007 (One (1) Page).
UK Search Report dated Oct. 3, 2007 (Two (2) Pages).
UK Search Report dated May 4, 2007 (Five (5) Pages).

* cited by examiner

*Primary Examiner* — Dharti Patel
(74) *Attorney, Agent, or Firm* — Crowell & Moring LLP

(57) ABSTRACT

In an emergency run down unit for a superconductive magnet assembly, a quench in the magnet is induced by the release of stored mechanical energy or by direct manual actuation.

20 Claims, 3 Drawing Sheets

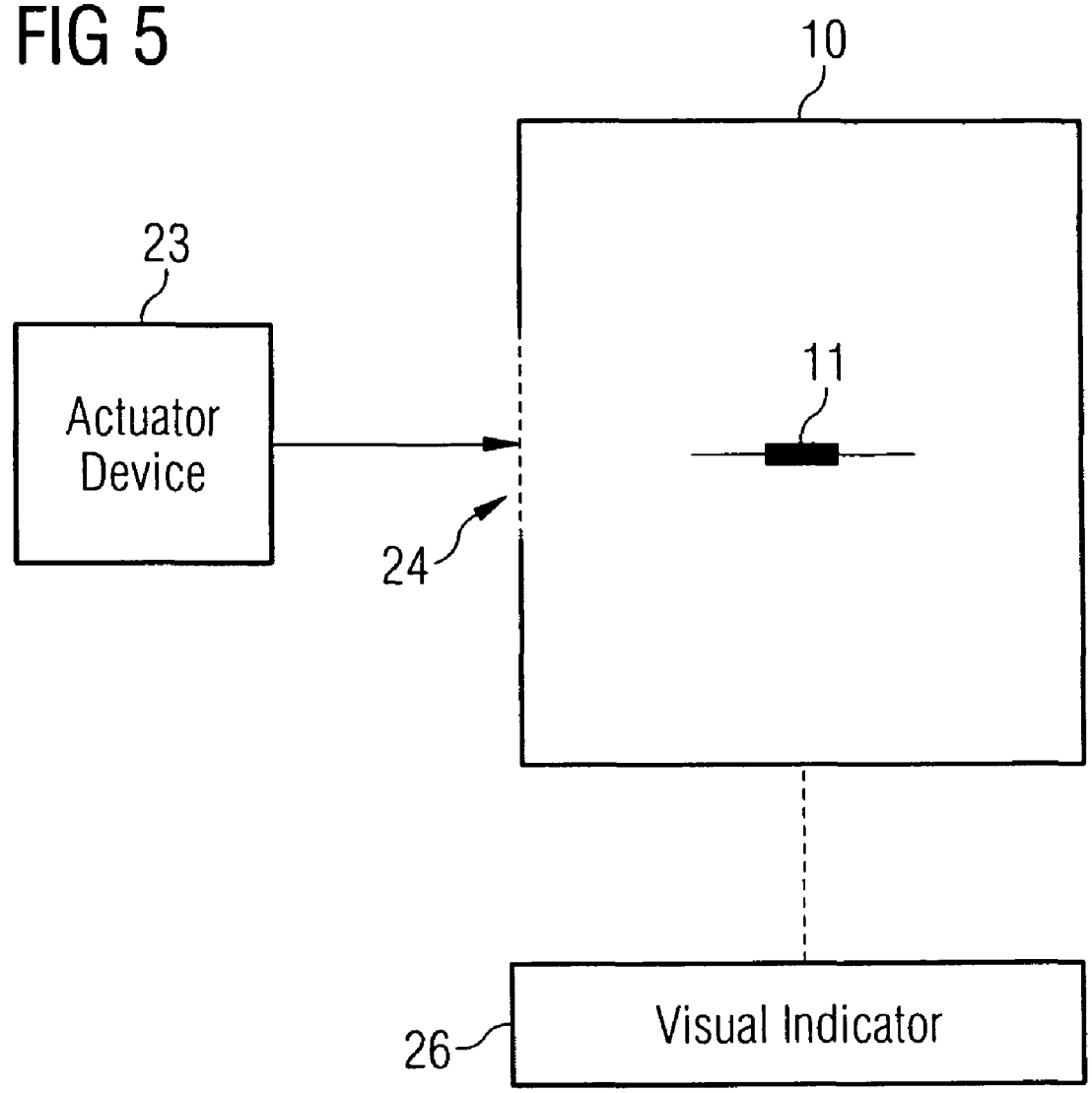

EMERGENCY RUN-DOWN UNIT FOR SUPERCONDUCTING MAGNETS

This invention relates to emergency run-down units for superconducting magnets, and it relates especially, though not exclusively, to such devices for promoting safe initiation of quench in superconducting magnets utilized for the examination of patients in magnetic resonance imaging (MRI) scanners.

BACKGROUND OF THE INVENTION

Superconducting magnet systems typically comprise coils of superconductive material wound on suitable formers mounted in a sealed cryogenic environment. These systems generate extremely intense magnetic fields and require precise and careful control, particularly when it is necessary to deliberately extinguish the magnetic field in order (for example) to attend to planned maintenance, or to effect repairs, or to meet changing operational requirements. For such planned operations, the magnetic field is usually extinguished by a controlled ramping down: that is, the electrical current flowing in the magnet coils is gradually reduced to or towards zero by extraction of current through current leads electrically connected to the magnet. This takes some time and requires effective control to be in place.

However, an emergency situation may arise in which it is necessary to quickly extinguish the magnetic field and/or to extinguish the magnetic field when the control systems are inoperational. For example, such situations may include: in order to release magnetic parts which have been unintentionally attracted to the magnet, possibly trapping a person close to the system; or in order to avoid the risk of metallic parts being attracted—for example when fire-fighters have to approach an active magnet with their full equipment, which contains bulky magnetic components. For such emergency operation, it is essential that the run-down unit should be capable of effectively initiating a quench in the magnet without mains electrical power. In situations such as a fire being present, the mains electrical power is likely to be lost. In the case of a person being trapped by the magnet, a reflex reaction may be to turn off mains electrical power in the mistaken belief that such action would turn off the magnetic field. It is thus necessary to provide reliable, non-mains dependent quench initiation devices as emergency run down units as part of, or in addition to, a controlled quenching system. It is usual for such emergency run down units to initiate a localized quenching event, and then to promote a controlled distribution of quenching events throughout the system.

It is also the case that such superconducting magnets can self-quench in response to a sudden and irreversible collapse of the magnetic field arising from any event which can cause localized disturbance of the superconductive state. This will lead to the creation of electrical resistance at the site of the disturbance, and a rapid build-up of localized heating which exacerbates the resistance. It is well known that, in order to reduce the risk of localized, possibly permanent, damage to the magnet coils, the quench should be distributed as widely as possible through the coils of the system shortly after the commencement of a quenching event. This is typically achieved through use of quench propagation devices, typically electric heaters, as part of a controlled quenching system.

Both eventualities are typically addressed by providing small electrical heaters as quench initiation or propagation devices, located adjacent the magnet coils. The heaters are arranged to be energized, thereby heating the magnet coils to bring them out of their superconducting state and so to raise the resistance of the magnet coils. The energizing may be effected automatically in response to one or more actuation criteria indicating the onset of accidental quenching, or manually in the case of an emergency situation where quenching is required despite the magnet operating correctly.

The amount of power required to initiate a quench is quite small: in the order of two watts for one second, being an energy input of 2J. It is straightforward to provide this from the mains power supply, but as discussed above it is a safety requirement that a quench may be initiated by the emergency run down unit of the present invention even during failure of the mains supply. In known arrangements, a battery back-up is typically provided, for use in energizing quench heaters in the event of a mains failure. However, difficulties and significant expense arise in providing and maintaining a secure and reliable battery powered back-up and, moreover, environmental considerations militate against the use of batteries.

The present invention aims to address one or more of the above issues.

The invention specifically eschews primary reliance on the use of batteries, in which the electrical energy is stored, preferring rather to generate the required power at a time of demand. The invention thus avoids not only the necessity of a back-up battery, but also the expense of providing a reliable maintenance program therefore, and the problems associated with responsible disposal thereof. In particular, the invention provides for the generation of electrical energy when required to cause quenching of the magnet coil, using stored mechanical energy or energy applied by muscular action by an operator.

SUMMARY OF THE INVENTION

The present invention provides an emergency run down unit for a superconductive magnet assembly, said emergency run down unit comprising: at least one electrical resistance associated with a coil of a superconductive magnet; and a quench initiation device which provides electrical energy to said resistance; wherein said quench initiation device comprises a generator of electrical energy and means for initiating a generation of said electrical energy by one of i) a release of stored mechanical energy, and ii) direct manual actuation, at the time of quenching of the coil.

The generator may comprise at least first and second components, arranged to generate electrical energy in response to at least a predetermined degree of relative movement between the said first and second components. In such an arrangement, one of said first and second components may comprise means for generating a static magnetic field, relative to which the other of said first and second components is arranged to move, whereby to generate said electrical energy. In such an arrangement, the means for generating a static magnetic field may be the superconductive magnet assembly. Alternatively, said magnetic field may be provided by a special-purpose, permanent magnet component.

The relative movement between the first and second components may be rotational or may be linear. The relative movement between the first and second components may be enhanced by gearing.

The generator may be adapted to be reset after actuation, and thereafter re-used. Alternatively, the generator may be replaceable and may be adapted for single use.

The generator may comprise: a generator component capable of generating electrical energy in response to mechanical stress; and actuator means associated with said generator component and being actuatable between first and second operational relationships with the generator component; wherein said actuator means is configured to subject said generator component to a varying degree of stress during a transition between said first and second relationships, thereby generating said electrical energy during said transition. Such an arrangement may further comprise a frangible member which holds said actuator means in said first relationship while it is intact, and which permits said actuator means to assume said second relationship when fractured. The frangible means may be adapted to be broken manually. The generator component may be maintained in a pre-stressed condition by means of the frangible link, whereby fracture of the frangible link releases stress from said generator component. The generator component may comprise a piezoelectric material.

In certain embodiments of the invention, the electrical resistance is also arranged to receive electrical energy derived from mains electrical power or a battery: and said generator of electrical energy may be provided as a back-up system which is operable in the event of failure of the mains electrical power or battery.

The present invention also provides an emergency run down unit for a superconductive magnet assembly, said emergency run down unit comprising: at least one coil of a superconductive magnet; means for applying to said coil sufficient energy to quench the coil and actuation means for impinging upon the coil, on demand, to create an interaction sufficient to induce quenching; wherein said actuation means comprises one of an externally-introduced object arranged to strike the coil, thereby to impart a mechanical impact, and a jet of gas at a temperature higher than the superconducting transition temperature of the material of the coil to be directed onto the coil.

Certain embodiments of the invention further comprise visually perceptible means for rendering its actuation visually evident.

BRIEF DESCRIPTION OF THE DRAWINGS

In order that the present invention may be clearly understood and readily carried into effect, certain embodiments thereof will now be described, by way of examples only, with reference to the accompanying drawings, in which:

FIG. 5 shows an alternative mechanism for initiating a quench of the superconducting magnet of FIG. 1, in accordance with an embodiment of the invention.

DETAILED DESCRIPTION OF THE INVENTION

Figure 1:
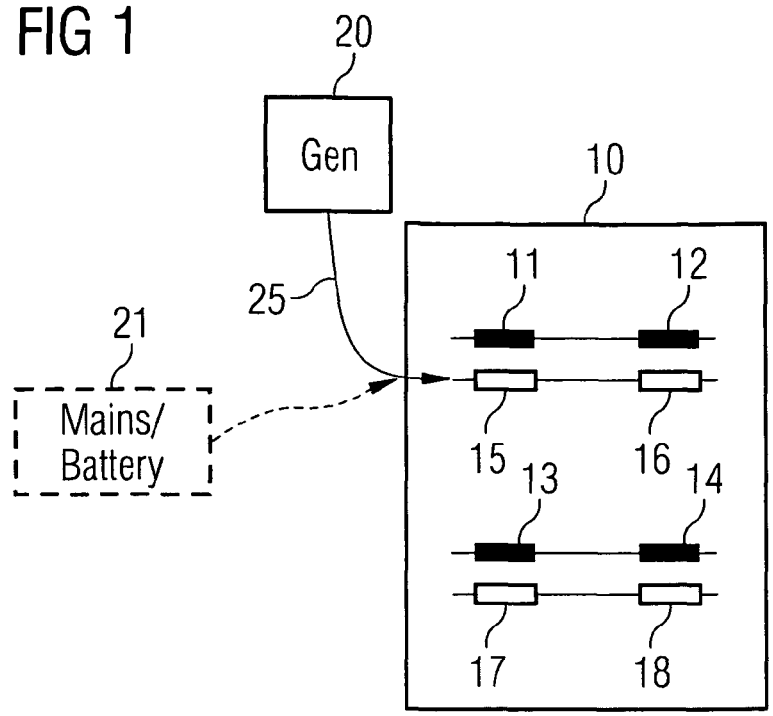
FIG. 1 shows, in schematic outline form, an emergency run down unit, comprising a generator, for a superconductive magnet assembly, in accordance with one embodiment of the invention.

Referring now to the drawing, as shown in FIG. 1, a superconductive magnet system comprising a plurality of individual magnet coils 11 to 14 with respective, associated resistive heaters 15 to 18 is shown schematically within a rectangular outline 10 which represents the sealed cryogenic chamber in which the coils are mounted for operation. The resistive heaters 15 to 18 can be wired for individual energization, or they may be wired in series, or in parallel or in various series/parallel combinations, according to design, and/or as dictated by functional requirements. While it is preferred that each coil should have at least one heater associated with it, the present invention may be applied to arrangements wherein this is not the case. The coils 11 to 14 may be disposed and coupled in any convenient manner known to those skilled in the art to achieve their desired functionality.

According to certain embodiments of the present invention, associated with the system 10 is a generator device 20 which is intended to be actuated in order to generate electrical energy for application to one or more of the heaters 15 to 18, so as to initiate a quench. (It is also possible, of course, to provide the generator 20 as a backup system, which is operable in the event of a failure of either the mains or a battery 21, as illustrated in dotted lines in FIG. 1).

Figure 2:
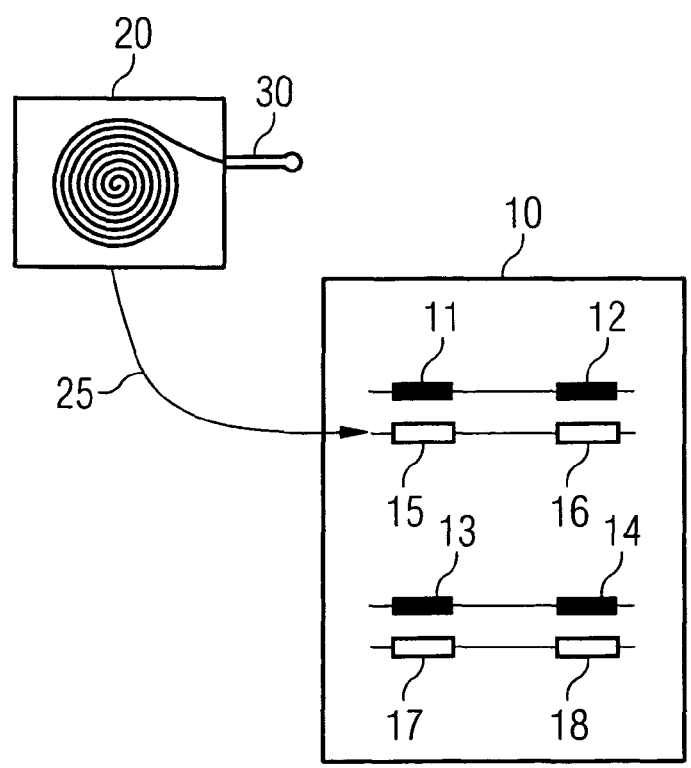
FIG. 2 shows another embodiment of the emergency run down unit, comprising a generator, for a superconductive magnet assembly, according to the invention.

The generator device 20 can take any of a number of possible forms. For example, as shown in FIG. 2, it can be in the form of a simple dynamo or other generator having a rotor that can be driven within a static magnetic field for a predetermined time; the drive being initiated by manual operation of an actuator, such as a cord or cable 30, which is initially wound around the rotor or a support linked to the rotor, and which is pulled to rotate the rotor and thereby to generate electrical energy which is coupled to one or more of the resistive heaters 15 to 18 associated with the coils 11 to 14 of the superconductive magnet system 10.

The generator 20 may be a complete device, including coils and a permanent magnet, positioned suitably far and/or being suitably shielded, from the superconducting magnet so as not to interfere with the magnetic field produced by the magnet coils 11-14. Alternatively, a set of rotor coils of non-magnetic electrically conductive wire (such as copper or aluminium) may be provided on a non-magnetic former and mounted non-magnetically within the field of the coils 11-14. When the generator 20 is to be activated, an operator causes the rotor coils to rotate within the magnetic field of the coils 11-14, thereby to generate the required electrical energy which may be conducted to the resistive heaters 15-18. Such an arrangement is simpler, as no permanent magnet need be provided, and the generator may be positioned close to the magnet. Moreover, the use of non-magnetic wire and structural components for this purpose minimizes any potential interference by the rotor coils with the main magnetic field generated by the coils 11-14.

As previously mentioned, the power demand is quite small (e.g. 2 watts) and needs to persist only for a second or so; thus the operational requirements of the generator 20 are quite straightforward to implement. If necessary, gearing can be used to increase the relative effect of the mechanical movement of the actuator upon the rotor.

Figure 3:
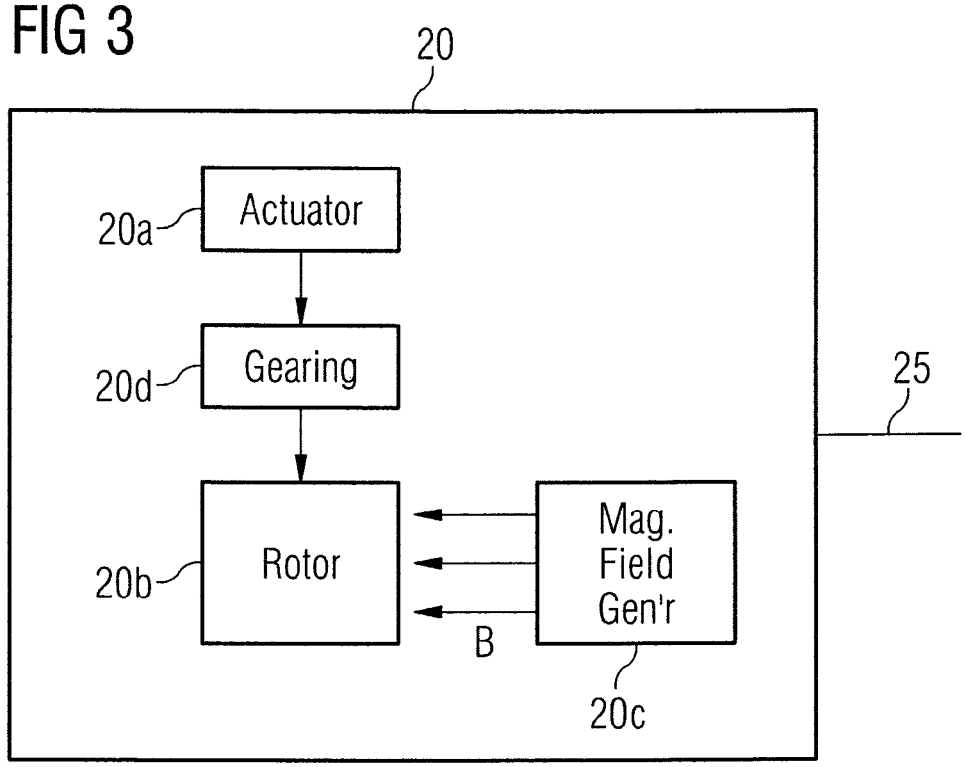
FIG. 3 shows a schematic block diagram of an embodiment of the generator shown in FIG. 1.

It will be appreciated that, as illustrated schematically in FIG. 3, various alternative means may be utilized as an actuator 20a for driving the rotor of such a generator are feasible, such as the use of a pre-loaded spring, as in a clockwork arrangement; a weight configured to fall on demand, manual operation such as by pulling on a handle 30 (FIG. 2) attached to a length of cord wrapped around the rotor or a support linked to the rotor. Alternatively to a conventional generator, the required electrical energy may be generated by a coil or other mobile device that is caused to traverse magnetic lines of force, for example a non-magnetic weight on a non-magnetic conductor being allowed to fall or swing through the magnetic field of the magnet, (all of which are represented schematically as a rotor 20b).

In general, embodiments such as illustrated in FIG. 1 provide an emergency run down unit, which may form part of a controlled quenching system for the superconductive magnet system 10. In such embodiments, the emergency run down unit has at least one electrically powered resistive heater such as 15 associated with at least one superconductive magnet coil such as 11 and a generator device 20 for applying, over an output line 25, sufficient electrical energy to the heater 15 to generate enough heat to quench the associated coil 11, and thus the system as a whole. As shown in FIG. 3, the generator 20 typically has first and second components, such as a rotor 20b and some means 20c for generating a static magnetic field, as well as some convenient means, such as the pulled cord or cable 30, or a spring-wound device, which serves as an actuator 20a for effecting at least a minimum degree of relative movement between the two components to generate the required electrical energy.

As illustrated schematically by the magnetic field generator 3 in FIG. 3, the static magnetic field may comprise a magnetic field generated by the superconductive magnet system 10 itself, but may be separately generated by means of a permanent magnet for example to allow for free positioning of the emergency run down unit, at some convenient location which may be distant from the superconducting magnet. Some generators have a permanent magnet rotor and stationary coils. Such generators may also be used in emergency run down units of the present invention.

Figure 4:
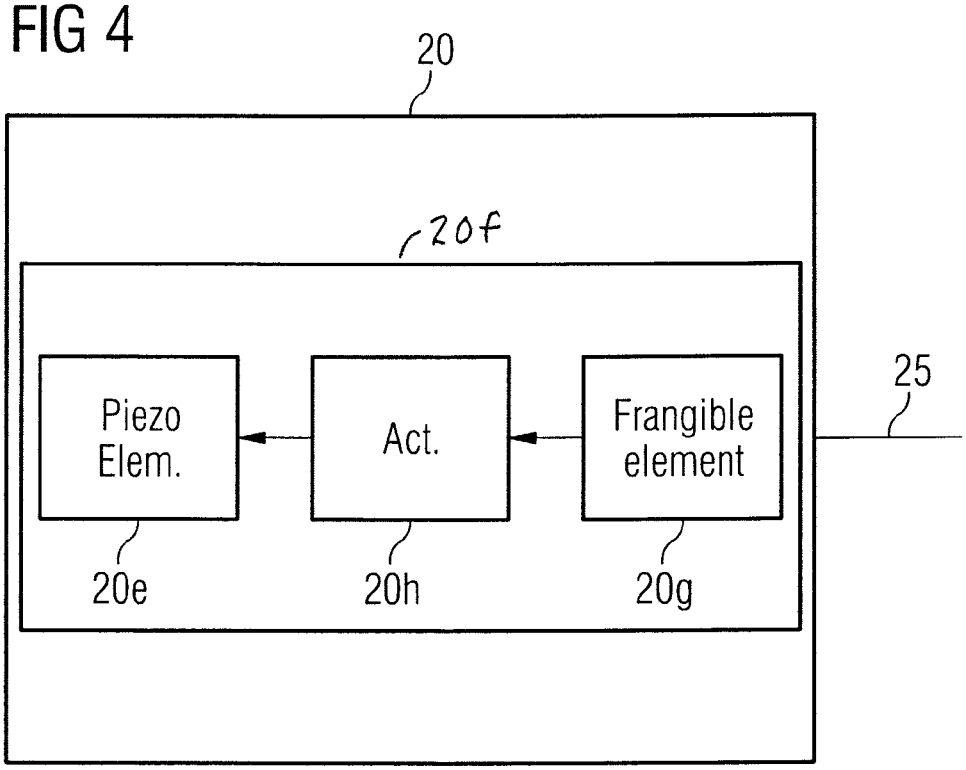
FIG. 4 shows another embodiment of the generator shown in FIG. 1.

In another embodiment of the invention illustrated in FIG. 4, the generator 20 comprises an active generator component such as a piezoelectric element 20e. In some such embodiments, the generator component is held under stress within a sealed container 20f having a frangible element 20g which, when fractured, releases the stress, thereby applying mechanical shock to the generator component sufficient to cause the element to release electrical energy for application to one or more of the resistive heaters such as 15. In this case, the invention provides, as before, an emergency run down unit for the superconductive magnet assembly 10 having at least one electrically powered resistive heater such as 15 associated with a superconductive magnet coil such as 11 and a generator device 20 for applying sufficient electrical energy to the heater 15 to generate enough heat to quench the coil. In this embodiment, however, the generator 20 incorporates an active generator component (the piezoelectric element in the example described above) capable of generating electrical energy in response to mechanical stress. Variants of this embodiment include arrangements wherein a weight such as a hammer may be caused to impinge onto the generator component to cause the generation of the required electrical energy.

Generally stated, in such embodiments, an actuator 20h (FIG. 4) is provided, associated with a generator component, and the actuator passes from a first operational relationship with the generator component to a second operational relationship with the generator component. During the transition from first to second operational relationship with the generator component, the actuator subjects the generator component to a changing degree of stress, resulting in the required generation of electrical energy.

In one embodiment, a frangible means 20g is employed which, when intact, holds the actuator means in its first operational relationship, and which, when fractured, permits the actuator means to assume its second operational relationship, thus changing the mechanical stress applied to said generator component and causing the element to generate the required electrical energy. In another, simple manual deformation of the generator component provides the required energy.

One example of such a generator component is a piezoelectric generator device. A single-use, replaceable piezoelectric generator device which may be adaptable for use in such an embodiment is shown in United Kingdom patent GB1485739 and the corresponding U.S. Pat. No. 3,976,898, the disclosure of which is hereby incorporated by reference (in particular, the disclosure at column 2, line 1 through column 5, line 18 and FIGS. 1-3 of the U.S. patent).

Deliberate quenches such as may be initiated by the emergency run down units of the present invention are usually very rare events, but the emergency run down unit must work reliably, so that one is sure that emergency run-down (quench) may be initiated when required. This is similar with many safety-related systems such as fire extinguishers and air-bags in motor vehicles. In order to assure such reliability, solutions may be attractive which have disposable emergency run down units which are replaced after a single use.

It will be appreciated that the invention is specifically intended to avoid the necessity for providing a battery to power the resistive heater; thereby saving the associated expense of providing a reliable maintenance program therefor; the expense and restrictions associated with the responsible disposal of spent batteries and reducing design drawbacks associated with technical restrictions imposed on the placement of batteries relative to the system enclosure.

The present invention envisages the replacement of stored electrical energy in the form of batteries with stored or generated mechanical energy. As such, there are many alternative arrangements that can be used in the present context. For example, as shown schematically in FIG. 5, by omitting the resistive heaters and instead providing direct access 24 (indicated by a broken line in the drawing) to at least one coil, an object or agency 23 may be arranged to impinge upon the coil to create an interaction sufficient to induce quenching. Such embodiments may comprise, for example, a mechanical impact induced by an externally-introduced object striking the coil; an infra-red source directed at part of the coil; or a jet of gas at a temperature higher than the superconducting transition temperature of the coil may be emitted under pressure from a tube, a bulb or a phial that can be broken manually or automatically when quenching is required, all of which are shown schematically by block 23 in FIG. 5. A temperature raise of about 2K in just a part of the coil is typically sufficient to induce the onset of a quench.

Yet further embodiments include the generation of sparks in the vicinity of the coil. The heat provided by a spark landing on a coil may be sufficient to induce quench. In such embodiments, a thermally conductive shield may be provided, over at least a part of the coil, to prevent damage to the coil by the sparks. The sparks may be provided by a spark generating mechanism in a known manner, by manual operation or operation by the release of stored mechanical energy. It may also be expedient to provide a visually perceptible indicator 26, which shows that the emergency rundown unit has been actuated.

Other embodiments utilize the energy stored in the magnetic field, by releasing a magnetic weight within the magnetic field of the magnet to initiate emergency run down (quench) when required. The ensuing motion may be used to mechanically impinge of the magnet, or to drive a conductor through the magnetic field to generate electrical energy for application to the heaters 15-18.

Of course, if required, any one magnet system may be provided with two or more similar or different quench initiation devices according to the present invention, for example, one activated by stored mechanical energy and one activated by manual operation; or one located close to the magnet and one located at some distance away from the magnet, accessible to an operator.

The emergency run down unit should preferably be constructed such that its method of operation is obvious, even to untrained personnel, who may be required to initiate emergency run down (quench) of the magnet without prior knowledge of the system or training in its use.

In any event, it is preferred that the emergency run down unit is constructed so that it is visually evident that it has been operated, to enable service/repair personnel to readily identify quench initiation events.

In embodiments of the present invention which include the generation of electrical energy which is applied to an electrically powered heater in order to initiate the required quench, the electrical heater may be arranged such that it may be activated by means of an emergency run down unit of the present invention as well as by mains electrical power or a battery. As such, the emergency run down unit of the present invention is combinable with conventional quench devices and may be used as a back-up system for such conventional quench devices.

It will be appreciated in general that quench events give rise to significant safety concerns, including the need to rapidly vent boiled-off coolant vapor, and the need to contain powerful stray magnetic fields generated by the rapid collapse of the magnetic field caused by the quench. Suitable vapor control systems and means for containment of the powerful stray fields are well known, and are not addressed by this invention. As is well known in the art, quench events can happen spontaneously, and means are conventionally provided to ensure a safe environment during quench of the magnet.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. An emergency run down unit for a superconductive magnet assembly said, the emergency run down unit comprising:
   at least one electrical resistance associated with a coil of a superconductive magnet; and
   a quench initiation device which provides electrical energy to said resistance;
   wherein said quench initiation device comprises a generator for generating said electrical energy and an actuator for initiating a generation of said electrical energy; and
   wherein said electrical energy is generated by a release of stored mechanical energy at the time of quenching of the coil.

2. An emergency run down unit according to claim 1, wherein the generator comprises at least first and second components, arranged to generate electrical energy in response to at least a predetermined degree of relative movement between said components.

3. An emergency run down unit according to claim 2, wherein one of said components comprises means for generating a static magnetic field, relative to which the other component is arranged to move whereby to generate said electrical energy.

4. An emergency run down unit according to claim 3, wherein the means for generating a static magnetic field is the superconductive magnet assembly.

5. An emergency run down unit according to claim 3, wherein said magnetic field is provided by a special-purpose, permanent magnet component.

6. An emergency run down unit according to any of claim 2, wherein the relative movement between the first and second components is one of rotational and linear.

7. An emergency run down unit according to claim 6, wherein the relative movement between the two components is enhanced by gearing.

8. An emergency run down unit according to claim 1, wherein the generator is adapted to be reset after actuation, and thereafter re-used.

9. An emergency run down unit according to claim 1, wherein the generator is replaceable and is adapted for single use.

10. An emergency run down unit according to claim 1, wherein the generator comprises:
    a generator component capable of generating electrical energy in response to mechanical stress; and
    actuator means associated with said generator component and being actuatable between first and second operational relationships with the generator component; wherein
    said actuator means is configured to subject said generator component to a varying degree of stress during a transition between said first and second relationships, thereby generating said electrical energy during said transition.

11. An emergency run down unit according to claim 10, further comprising a frangible member which holds said actuator means in said first relationship while it is intact, and which permits said actuator means to assume said second relationship when fractured.

12. An emergency run down unit according to claim 11, wherein the frangible means is adapted to be broken manually.

13. An emergency run down unit according to claim 11, wherein said generator component is maintained in a prestressed condition by means of the frangible link, whereby fracture of the frangible link releases stress from said generator component.

14. An emergency run down unit according to 10, wherein the generator component comprises a piezoelectric material.

15. An emergency run down unit according to claim 1, wherein:
    the electrical resistance is also arranged to receive electrical energy derived from one of mains electrical power and a battery: and
    said generator of electrical energy is provided as a back-up system which is operable in the event of failure of the mains electrical power or battery.

16. An emergency run down unit according to claim 1, further comprising visually perceptible means for rendering its actuation visually evident.

17. An emergency run down unit for a superconductive magnet assembly, said emergency run down unit comprising:
    at least one coil of a superconductive magnet;
    means for applying to said coil sufficient energy to quench the coil; and
    actuation means for impinging upon the coil, on demand, to create an interaction sufficient to induce quenching;
    wherein said actuation means comprises one of an externally-introduced object arranged to strike the coil, thereby to impart a mechanical impact, and a jet of gas at a temperature higher than the superconducting transition temperature of the material of the coil to be directed onto the coil.

18. An emergency run down unit according to claim 17, further comprising visually perceptible means for rendering its actuation visually evident.

19. An emergency run down unit for a superconductive magnet assembly said, the emergency run down unit comprising:
- at least one electrical resistance associated with a coil of a superconductive magnet; and
- a quench initiation device which provides electrical energy to said resistance;
- wherein said quench initiation device comprises a generator for generating said electrical energy and an actuator for initiating a generation of said electrical energy; and
- wherein said electrical energy is generated using energy applied by muscular action by an operator at the time of quenching of the coil.

20. An emergency run down unit according to claim 19, wherein the electrical energy is generated by manual operation of a rotor, thereby generating electrical energy.

* * * * *